United States Patent
Kim et al.

(10) Patent No.: US 11,024,662 B2
(45) Date of Patent: Jun. 1, 2021

(54) DUAL IMAGE SENSOR

(71) Applicant: SAMSUNG ELECTRONICS CO., LTD., Suwon-si (KR)

(72) Inventors: Hyochul Kim, Yongin-si (KR); Younggeun Roh, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/385,503

(22) Filed: Apr. 16, 2019

(65) Prior Publication Data
US 2020/0105811 A1 Apr. 2, 2020

(30) Foreign Application Priority Data

Oct. 2, 2018 (KR) .................. 10-2018-0117876

(51) Int. Cl.
| | | |
|---|---|---|
| *H01L 27/146* | (2006.01) |
| *H01L 25/04* | (2014.01) |
| *H01L 23/64* | (2006.01) |
| *H01L 23/552* | (2006.01) |
| *H01L 27/148* | (2006.01) |

(52) U.S. Cl.
CPC .. *H01L 27/14629* (2013.01); *H01L 27/14621* (2013.01); *H01L 27/14627* (2013.01); *H01L 27/148* (2013.01); *H01L 27/14643* (2013.01)

(58) Field of Classification Search
CPC combination set(s) only.
See application file for complete search history.

(56) References Cited

U.S. PATENT DOCUMENTS

| | | | |
|---|---|---|---|
| 7,583,863 B2 * | 9/2009 | Fouquet | G01J 3/10 250/370.06 |
| 8,203,635 B2 | 6/2012 | Lee | |
| 8,866,950 B2 | 10/2014 | Yokogawa | |
| 2005/0249377 A1 * | 11/2005 | Fouquet | G01J 3/10 382/103 |
| 2014/0036953 A1 * | 2/2014 | Kimura | G01J 5/02 374/121 |
| 2015/0144770 A1 | 5/2015 | Choi | |
| 2019/0101444 A1 * | 4/2019 | Yoon | G01J 3/0262 |

(Continued)

FOREIGN PATENT DOCUMENTS

| | | |
|---|---|---|
| KR | 10-0853196 B1 | 8/2008 |
| KR | 10-1204996 B1 | 11/2012 |

(Continued)

OTHER PUBLICATIONS

"apollo sensor: nano spectrometer-on-a-chip", Dec. 14, 2014, © nanoLambda, 1 page total.

(Continued)

*Primary Examiner* — Moazzam Hossain
(74) *Attorney, Agent, or Firm* — Sughrue Mion, PLLC (57) ABSTRACT

Provided are a dual image sensor including an image sensor including a first area and a second area, the first area and the second area including a plurality of pixels, respectively, a band-pass filter layer provided on the first area, the band-pass filter layer configured to transmit light emitted by an object and having a specific wavelength corresponding to physical property information of the object to the image sensor, and a planarization layer provided on the second area and on the same plane as the band-pass filter layer.

20 Claims, 10 Drawing Sheets

(56) References Cited

U.S. PATENT DOCUMENTS

2019/0131333 A1* 5/2019 Borthakur ......... H01L 27/14623
2019/0259902 A1* 8/2019 Shimizu .................. G01S 17/89
2020/0105815 A1* 4/2020 Huang ................ H01L 27/1469

FOREIGN PATENT DOCUMENTS

KR         10-1416552 B1    8/2014
KR     10-2018-0015067 A    2/2018

OTHER PUBLICATIONS

"Mini-spectrometer", Jan. 2019, Hamamatsu Photon is our Business, [Micro Series], C12880MA, 17 pages total.

* cited by examiner

DUAL IMAGE SENSOR

CROSS-REFERENCE TO RELATED APPLICATION

This application claims priority from Korean Patent Application No. 10-2018-0117876, filed on Oct. 2, 2018, in the Korean Intellectual Property Office, the disclosure of which is incorporated herein in its entirety by reference.

BACKGROUND

1. Field

Example embodiments of the present disclosure relate to dual image sensors, and more particularly, to dual image sensors used to obtain different kinds of feature information.

2. Description of the Related Art

Spectroscopes are optical instruments, and related art spectroscopes include various optical devices and thus are voluminous and heavy. As related applications such as smartphones and wearable devices have recently been miniaturized, spectroscopes are required to be miniaturized.

Spectroscopes may be implemented as independent devices or may be components of other devices. In particular, the study on spectroscopes mounted on mobile devices such as mobile phones has been conducted.

SUMMARY

One or more example embodiments provide dual image sensors used to obtain physical properties of objects.

One or more example embodiments provide electronic devices including dual image sensors.

Additional aspects will be set forth in part in the description which follows and, in part, will be apparent from the description, or may be learned by practice of example embodiments.

According to an aspect of an example embodiment, there is provided a dual image sensor including an image sensor including a first area and a second area, each of the first area and the second area including a plurality of pixels, a band-pass filter layer provided on the first area, the band-pass filter layer being configured to transmit, to the image sensor, light that is emitted by an object and has a specific wavelength corresponding to physical property information of the object, and a planarization layer provided on the second area and on a same plane as the band-pass filter layer.

The planarization layer may have a thickness that is equal to or greater than a thickness of the band-pass filter layer.

The planarization layer may include an insulating material.

The planarization layer may include at least one of silicon oxide, silicon nitride, and resin.

The planarization layer may include a first planarization layer provided on the second area, and a second planarization layer provided on the first planarization layer and the band-pass filter layer.

The band-pass filter layer may contact the planarization layer.

The first area may include an edge portion of the image sensor, and the second area may include a middle portion of the image sensor.

The band-pass filter layer may surround the planarization layer on the same plane of the image sensor.

The image sensor may include at least one of a charge-coupled device and a complementary metal-oxide semiconductor.

The band-pass filter layer may include a plurality of filter units configured to resonate and emit the light having the specific wavelength.

The at least one filter unit of the plurality of filter units include a cavity layer, a Bragg reflection layer provided on a first surface of the cavity layer, and a pattern reflection layer provided on a second surface of the cavity layer that is opposite the first surface of the cavity layer, the pattern reflection layer being configured to generate guided mode resonance and including a plurality of reflective structures that are periodically provided.

The pattern reflection layer may further include a filling layer filling spaces between the plurality of reflective structures, the filling layer having a refractive index that is different from refractive indices of the plurality of reflective structures.

The pattern reflection layer may further include a cover layer covering the plurality of reflective structures, the cover layer having a refractive index that is different from refractive indices of the plurality of reflective structures.

The plurality of reflective structures may be periodically provided at a pitch that is less than a resonance wavelength of the at least one filter unit of the plurality of filter units.

A resonance wavelength of the at least one filter unit among the plurality of filter units may be based on at least one of a pitch, a thickness, and a duty cycle of the plurality of reflective structures.

The dual image sensor may further include a color filter layer provided on the planarization layer.

The color filter layer may be further provided on the band-pass filter layer.

The dual image sensor may further include a micro-lens array provided on the color filter layer.

According to an aspect of an example embodiment, there is provided an optical device including a light source configured to emit light to an object, a lens configured to focus light emitted from the object that is irradiated by the light emitted from the light source, and a dual image sensor configured to receive the light focused by the lens, the dual image sensor including an image sensor including a first area and a second area, each of the first area and the second area including a plurality of pixels, a band-pass filter layer provided on the first area, the band-pass filter layer being configured to transmit, to the image sensor, light that is emitted by an object and has a specific wavelength corresponding to physical property information of the object, and a planarization layer provided on the second area and on a same plane as the band-pass filter layer.

The optical device may further include a processor configured to obtain the physical property information of the object based on a detection result of the pixels included in the first area, and obtain image information of the object based on a detection result of the pixels included in the second area.

The pattern reflection layer may further include a connection layer configured to connect the plurality of reflective structures, the connection layer having a thickness that is less than a thickness of the plurality of reflective structures.

The dual image sensor, wherein at least one of the plurality of filter units may include a cavity layer, a first Bragg reflection layer provided on a first surface of the cavity layer, a second Bragg reflection layer provided on a second surface of the cavity layer that is opposite the first surface of the cavity layer, and a pattern reflection layer included in the cavity layer, the pattern reflection layer being configured to generate guided mode resonance, and including a plurality of reflective structures that are periodically provided.

The pattern reflection layer may contact an inner surface of the first Bragg reflection layer.

The pattern reflection layer may further contact an inner surface of the second Bragg reflection layer.

BRIEF DESCRIPTION OF THE DRAWINGS

The above and/or other aspects will become apparent and more readily appreciated from the following description of example embodiments, taken in conjunction with the accompanying drawings in which.

DETAILED DESCRIPTION

The present disclosure will now be described more fully with reference to the accompanying drawings, in which example embodiments of the present disclosure are shown. In the drawings, widths and thicknesses of layers or areas may be exaggerated for clarity and convenience of explanation. Like reference numerals denote like elements in the drawings.

It will be understood that the terms "comprise" or "include" should not be construed as including all elements or steps described in the specification and may omit some elements or some steps or may further include additional elements or steps.

Also, when a first element is "on ~" or "over" a second element, it may include a case where the first element contacts the second element and is directly located on the top, bottom, left, or right of the second element, and a case where the first element does not contact the second element and is located on the top, bottom, left, or right of the second element with a third element therebetween. The example embodiments will be described in detail with reference to the attached drawings.

While such terms as "first", "second", etc., may be used to describe various components, such components must not be limited to the above terms. The above terms are used only to distinguish one component from another.

Also, the terms such as " . . . unit" or " . . . module" refer to units that perform at least one function or operation, and the units may be implemented as hardware or software or as a combination of hardware and software.

As used herein, the term "and/or" includes any and all combinations of one or more of the associated listed items. Expressions such as "at least one of", when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1:
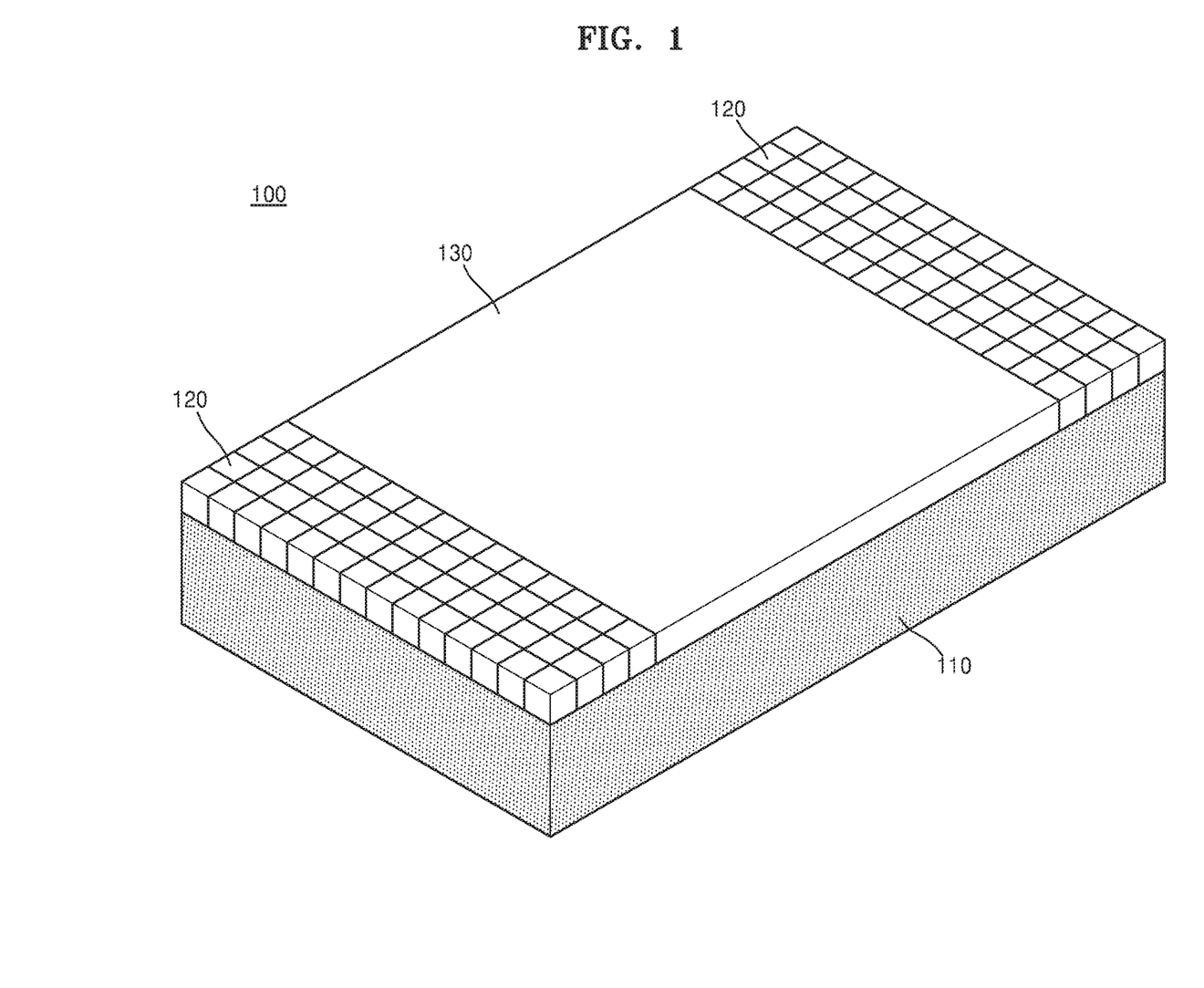
FIG. 1 is a perspective view of a dual image sensor according to an example embodiment.
Figure 2:
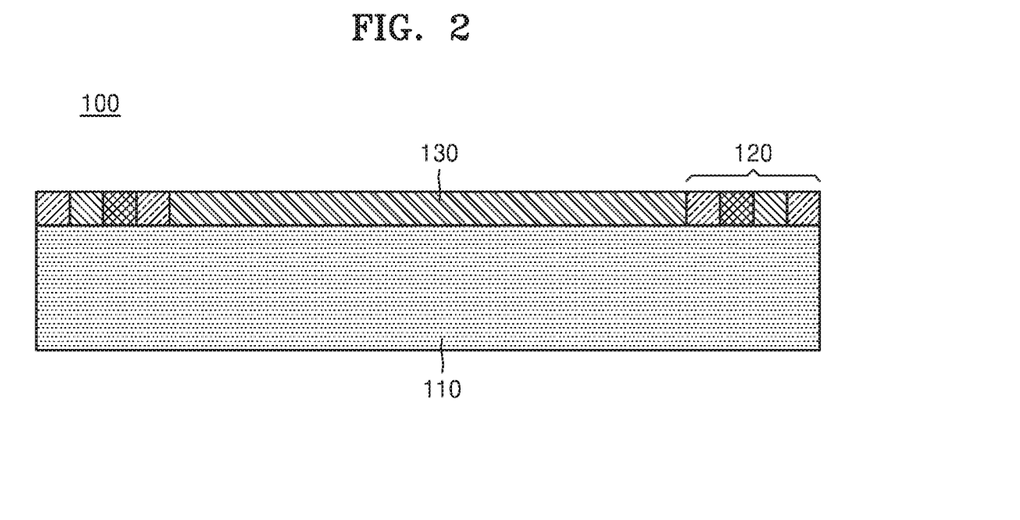
FIG. 2 is a cross-sectional view of the dual image sensor of FIG. 1.

FIG. 1 is a perspective view of a dual image sensor 100 according to an example embodiment. FIG. 2 is a cross-sectional view of the dual image sensor 100 of FIG. 1. As shown in FIGS. 1 and 2, the dual image sensor 100 according to an example embodiment may include an image sensor 110, a band-pass filter layer 120 located on the image sensor 110, and a planarization layer 130.

The image sensor 110 may detect light incident form an object. The light may be light emitted by the object, and may be light scattered or reflected by the object. The image sensor 110 may include pixels that are two-dimensionally arranged. Each of the pixels may receive incident light and may convert the light into an electrical signal, and may include a photodetector such as a photodiode and one or more transistors for activating each photodetector. The image sensor 110 may include at least one of, for example, a charge-coupled device (CCD) and a complementary metal-oxide semiconductor (CMOS). The image sensor 110 may include a first area and a second area in each of which pixels are arranged.

The band-pass filter layer 120 may pass light having a specific wavelength corresponding to physical property information of the object therethrough from among light incident from the object, and may apply the light having the specific wavelength to the image sensor 110. The band-pass filter layer 120 may be located on the first area of the image sensor 110, and may include a plurality of filter units 200 through which the light having the specific wavelength resonates and is emitted.

The plurality of filter units 200 may be two-dimensionally arranged. However, embodiments are not limited thereto, and the plurality of filter units 200 may be one-dimensionally arranged. The plurality of filter units 200 included in the band-pass filter layer 120 may resonate in the same wavelength band. However, example embodiments are not limited thereto. At least some of the plurality of filter units 200 may resonate at different wavelengths.

The planarization layer 130 may be located on the second area of the image sensor 110 to be on the same plane as the band-pass filter layer 120. The planarization layer 130 may eliminate a level difference between the image sensor 110 and the band-pass filter layer 120. A thickness of the planarization layer 130 may be equal to or greater than a thickness of the band-pass filter layer 120. In FIGS. 1 and 2, a thickness of the planarization layer 130 and a thickness of the band-pass filter layer 120 are the same. The planarization layer 130 may be used as a buffer layer for preventing damage to the image sensor 110 in a process of forming the band-pass filter layer 120. Side surfaces of the planarization layer 130 may contact a side surface of the band-pass filter layer 120, and a bottom surface of the planarization layer 130 may contact the image sensor 110.

The planarization layer 130 may be formed of a transparent insulating material. For example, the planarization layer 130 may include at least one of silicon oxide, silicon nitride, resin, and a combination thereof.

Figure 3:
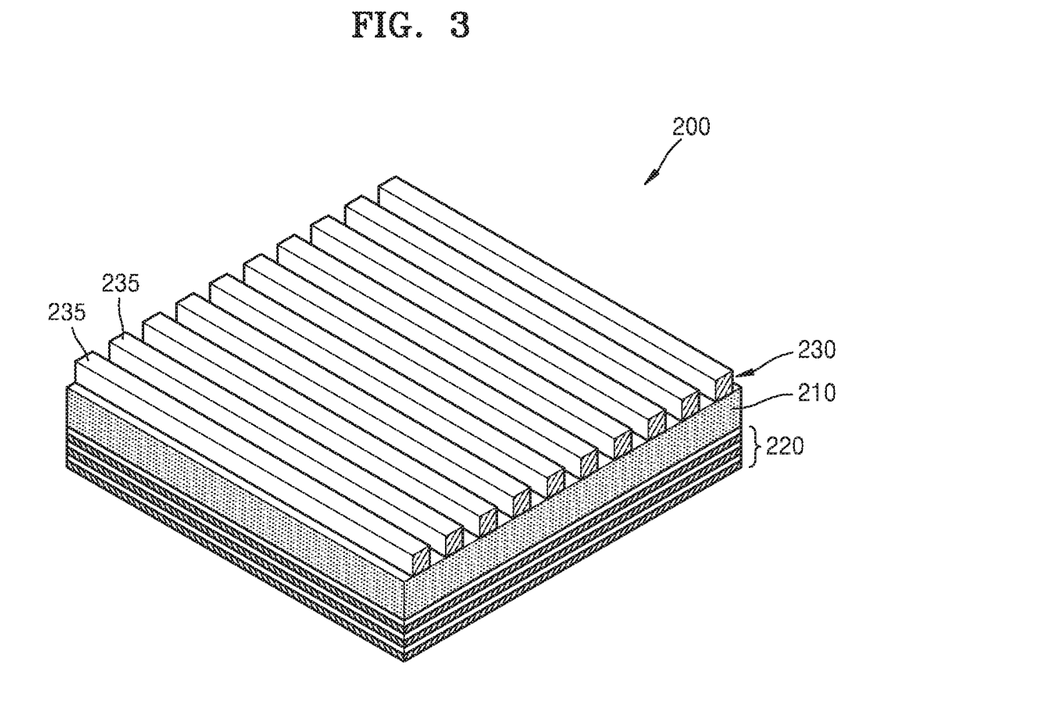
FIG. 3 is a perspective view illustrating a filter unit of a band-pass filter layer of FIG. 1.
Figure 4:
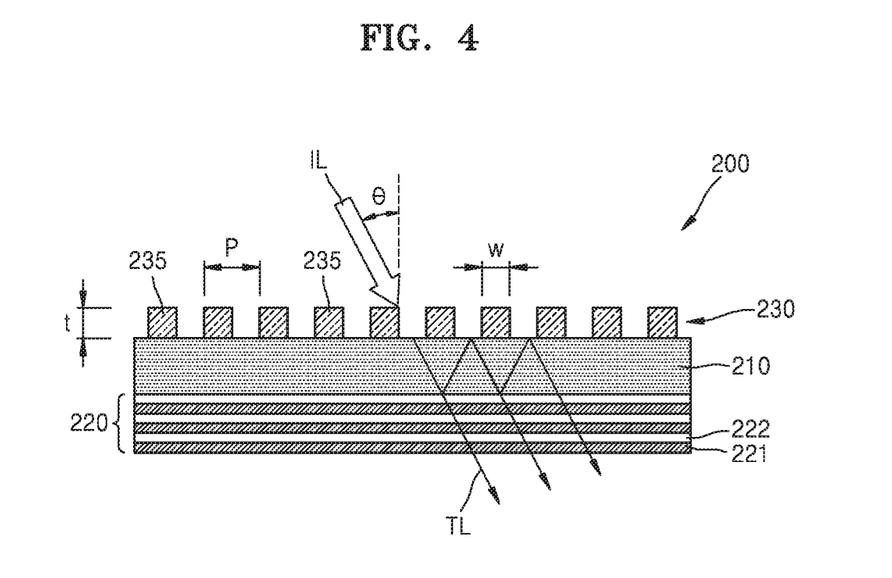
FIG. 4 is a cross-sectional view illustrating the filter unit of FIG. 3.

FIG. 3 is a perspective view illustrating the filter unit 200 of the band-pass filter layer 120 of FIG. 1. FIG. 4 is a cross-sectional view illustrating the filter unit 200 of FIG. 3.

Referring to FIGS. 3 and 4, the filter unit 200 includes a cavity layer 210, a Bragg reflection layer 220 provided on a first surface of the cavity layer 210, and a pattern reflection layer 230 provided on a second surface of the cavity layer 210 that is opposite to the first surface of the cavity layer 210.

The Bragg reflection layer 220 may be provided on the first surface of the cavity layer 210, for example, a bottom surface of the cavity layer 210. The Bragg reflection layer 220 is typically referred to as a distributed Bragg reflector (DBR). The Bragg reflection layer 220 may have a structure in which a plurality of material layers having different refractive indices are alternately stacked. The Bragg reflection layer 220 having the structure may reflect light due to periodic variation in a refractive index.

In FIG. 4, first and second material layers 221 and 222 having different refractive indices are alternately stacked three times in the Bragg reflection layer 220. The first and second material layers 221 and 222 may include semiconductor materials having different refractive indices. For example, the first material layer 221 may be formed of silicon dioxide ($SiO_2$) (a refractive index of 1.46), and the second material layer 222 may be formed of silicon (Si) (a refractive index of 3.8). However, embodiments are not limited thereto, and the first and second material layers 221 and 222 may be formed of various other materials according to design conditions such as a wavelength of incident light.

The pattern reflection layer 230 may be provided on the second surface of the cavity layer 210, for example, a top surface of the cavity layer 210. The pattern reflection layer 230 may increase a reflectance in a very narrow wavelength range by generating guided-mode resonance (GMR). To this end, the pattern reflection layer 230 may include a plurality of reflective structures 235 that may generate GMR and are periodically arranged. The reflective structures 235 may be arranged at a pitch P that is less than a resonance wavelength corresponding to the filter unit 200.

In the example embodiment, the reflective structures 235 of the pattern reflection layer 230 may be one-dimensionally arranged on the top surface of the cavity layer 210. In detail, the reflective structures 235 may be manufactured to each have a linear shape having a width w and a thickness t, and may be arranged in one direction at the pitch P to be parallel to one another. In FIG. 4, each of the reflective structures 235 has a quadrangular cross-sectional shape. However, embodiments are not limited thereto, and each of the reflective structures 235 may have any of other polygonal cross-sectional shapes such as a triangular shape.

Each of the reflective structures 235 may include a semiconductor material having a predetermined refractive index. For example, the reflective structure 235 may be formed of Si (a refractive index of 3.8). However, example embodiments are not limited thereto, and the reflective structure 235 may include, for example, gallium arsenide (GaAs), gallium phosphide (GaP), silicon nitride (SiN), or titanium oxide ($TiO_2$). The reflective structure 235 may be formed of any of various materials according to design conditions such as a wavelength of incident light.

In the example embodiment, a resonance wavelength of each of the filter units 200 of the band-pass filter layer 120 may be determined by at least one of the pitch P, the thickness t, and a duty cycle of the reflective structures 235. Accordingly, the filter units 200 having different resonance wavelengths may be more easily implemented by changing at least one of the pitch P, the thickness t, and the duty cycle of the reflective structures 235 constituting the pattern reflection layer 230.

The cavity layer 210 may be provided between the Bragg reflection layer 220 and the pattern reflection layer 230. The cavity layer 210 may include a material having a refractive index lower than that of the reflective structures 235 of the pattern reflection layer 230. For example, the cavity layer 210 may be formed of $SiO_2$ (a refractive index of 1.46). However, embodiments are not limited thereto, and the cavity layer 210 may be formed of any of various other materials according to design conditions such as a wavelength of incident light.

In this structure, light IL incident on the cavity layer 210 from a top surface of the filter unit 200 reciprocates in the cavity layer 210 located between the Bragg reflection layer 220 and the pattern reflection layer 230, and causes constructive interference and destructive interference. Light TL having a specific resonance wavelength satisfying a constructive interference condition may be emitted through a bottom surface of the filter unit 200 on the image sensor 110.

In the example embodiment, the filter unit 200 may increase a reflectance in a very narrow wavelength range by including the pattern reflection layer 230 having a grating structure for generating GMR. Accordingly, a change in a resonance wavelength according to a change in an incidence angle of the light IL incident on the filter unit 200 may be greatly reduced. Also, the filter units 200 having different resonance wavelengths may be easily formed by changing the pitch P, the thickness t, or the duty cycle of the reflective structures 235 of the pattern reflection layer 230. Accordingly, a process of manufacturing the band-pass filter layer 120 may be simplified, and manufacturing costs and time may be reduced.

Since the band-pass filter layer 120 is located on a portion of the image sensor 110 as stated above, the image sensor 110 may perform not only an original operation of, for example, detecting light to generate an image by a location of the image sensor 110 not including the band-pass filter layer 120, but also an operation of detecting light having a specific wavelength to obtain physical property information of an object by a portion of the image sensor including the band-pass filter layer 120.

FIGS. 5A through 5F are cross-sectional views illustrating the filter unit 200 of the band-pass filter layer 120 applicable to the dual image sensor 100.

Figure 5A:
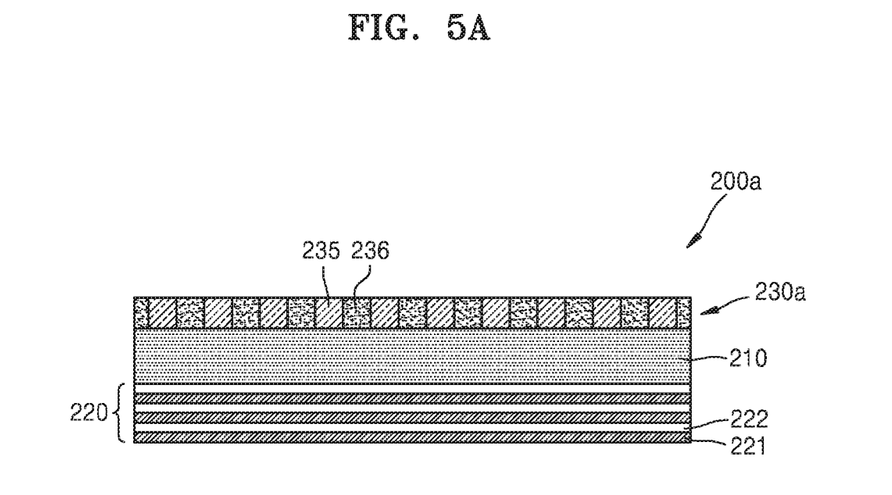
FIGS. 5A, 5B, 5C, 5D, 5E, and 5F are cross-sectional views illustrating the filter unit of the band-pass filter layer applicable to the dual image sensor.

Referring to FIGS. 4 and 5A, a pattern reflection layer 230a of a filter unit 200a of FIG. 5A may include the plurality of reflective structures 235 that are periodically arranged at predetermined intervals and a filling layer 236 filling spaces between the reflective structures 235. The reflective structures 235 may be one-dimensionally arranged on a top surface of the cavity layer 210. Each of the reflective structures 235 may be manufactured to have a linear shape having a predetermined width and a predetermined thickness, and the reflective structures 235 may be arranged in one direction at a predetermined pitch to be parallel to one another.

The filling layer 236 may be provided on the top surface of the cavity layer 210 to fill spaces between the reflective structures 235. The filling layer 236 may be formed to have the same thickness as that of each of the reflective structures 235. However, example embodiments are not limited thereto, and the filling layer 236 may be formed to have a thickness less than that of each of the reflective structures

235. The filling layer 236 may include a material having a refractive index different from those of the reflective structures 235.

The filling layer 236 may include a material having a refractive index lower than that of the reflective structures 235. The reflective structures 235 may include a material having a high refractive index such as Si, GaAs, GaP, SiN, or $TiO_2$, and the filling layer 236 may include a material having a refractive index lower than that of the reflective structures 235, for example, $SiO_2$, a polymer-based material (SU-8 or polymethyl methacrylate (PMMA)), or hydrogen silsesquioxane (HSQ). However, embodiments are not limited thereto, and the reflective structures 235 and the filling layer 236 may include various materials other than the above materials.

Although the reflective structures 235 include a material having a refractive index higher than that of the filling layer 236, example embodiments are not limited thereto and the reflective structures 235 may include a material having a refractive index lower than that of the filling layer 236. A resonance wavelength corresponding to the filter unit 200a may be determined by changing at least one of a pitch, a duty, and a duty cycle of the reflective structures 235 of the pattern reflection layer 230a. The cavity layer 210 may be provided between the Bragg reflection layer 220 and the pattern reflection layer 230a.

Figure 5B:
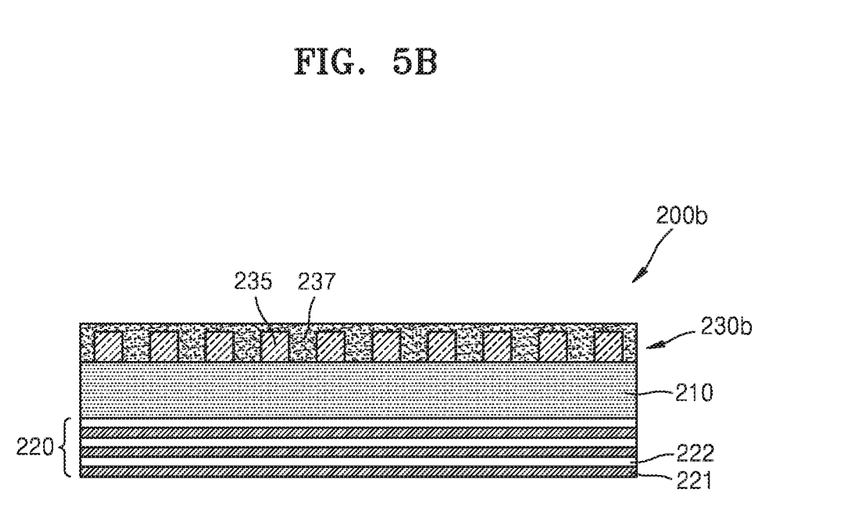

When FIGS. 4 and 5B are compared with each other, a pattern reflection layer 230b of a filter unit 200b of FIG. 5B may include the plurality of reflective structures 235 that are periodically arranged at predetermined intervals and a cover layer 237 covering the reflective structures 235. The cover layer 237 may be provided on a top surface of the cavity layer 210 to cover the reflective structures 235. The cover layer 237 may include a material having a refractive index different from those of the reflective structures 235. For example, the cover layer 237 may include a material having a refractive index lower than that of the reflective structures 235. However, example embodiments are not limited thereto, and the reflective structures 235 may include a material having a refractive index lower than that of the cover layer 237.

Figure 5C:
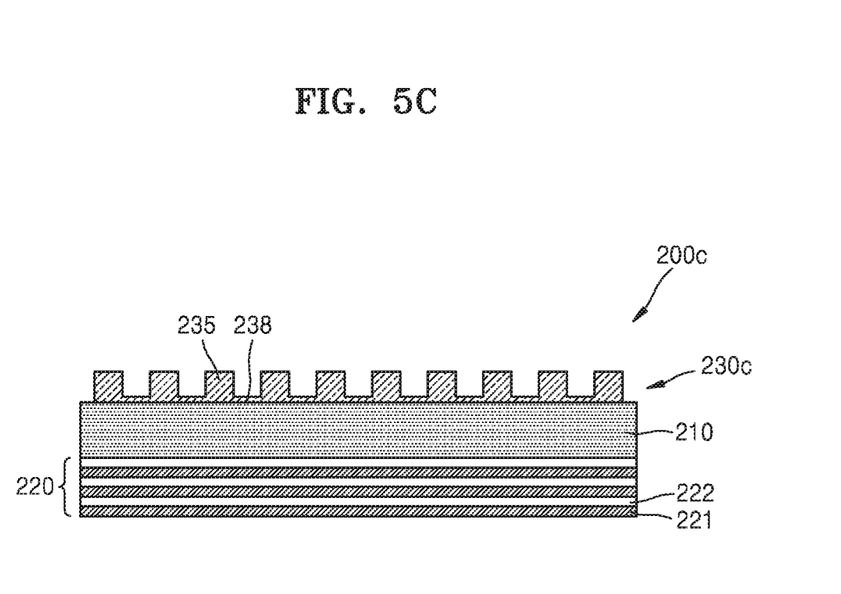

A pattern reflection layer 230c of a filter unit 200c of FIG. 5C may include the plurality of reflective structures 235 that are periodically arranged at predetermined intervals and a connection layer 238 configured to connect the reflective structures 235. The connection layer 238 may be provided on a top surface of the cavity layer 210 to connect the reflective structures 235. The connection layer 238 may be formed to have a thickness less than that of each of the reflective structures 235. The connection layer 238 may be integrally formed with the reflective structures 235 and may include the same material as that of the reflective structures 235. A resonance wavelength of the filter unit 220c may be determined by changing at least one of a pitch, a thickness, and a duty cycle of the reflective structures 235 of the pattern reflection layer 230c. The cavity layer 210 may be provided between the Bragg reflection layer 220 and the pattern reflection layer 230c.

Figure 5D:
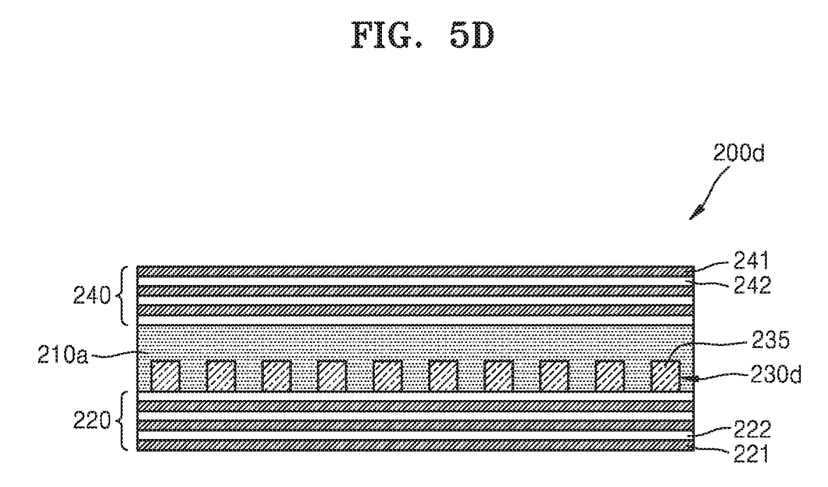

A filter unit 200d of FIG. 5D includes a cavity layer 210a, a first Bragg reflection layer 220 provided on a first surface of the cavity layer 210a, a second Bragg reflection layer 240 provided on a second surface of the cavity layer 210a that is opposite the first surface of the cavity layer 210a, and a pattern reflection layer 230d provided in the cavity layer 210a.

The first Bragg reflection layers 220 and the second Bragg reflection layer 240 may be respectively provided on a bottom surface and a top surface of the cavity layer 210a. Each of the first Bragg reflection layers 220 and the second Bragg reflection layer 240 may have a structure in which a plurality of material layers having different refractive indices are alternately stacked. The cavity layer 210a is provided between the first Bragg reflection layers 220 and the second Bragg reflection layer 240. The pattern reflection layer 230d is provided in the cavity layer 210a, where the pattern reflection layer 230d in is contact with one of the first Bragg reflection layers 220 and the second Bragg reflection layer 240.

Figure 5E:
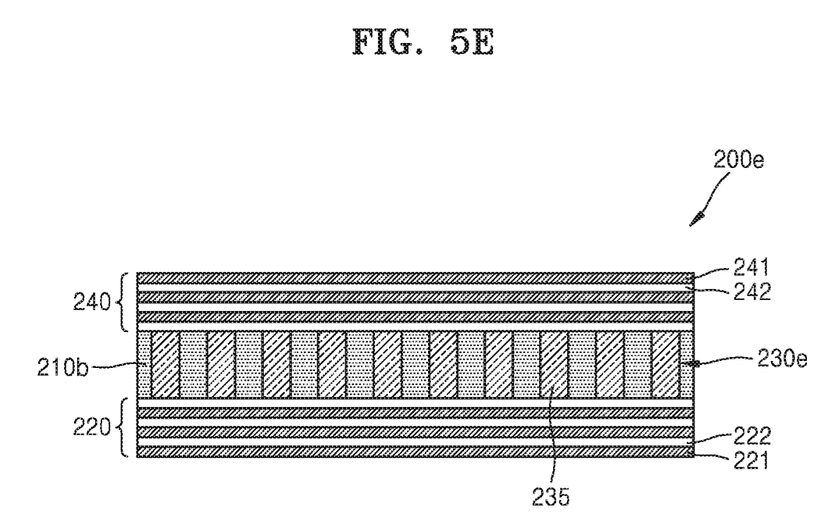

When FIGS. 5D and 5E are compared with each other, a pattern reflection layer 230e of a filter unit 200e of FIG. 5E may contact inner surfaces of the first Bragg reflection layers 220 and the second Bragg reflection layer 240.

Figure 5F:
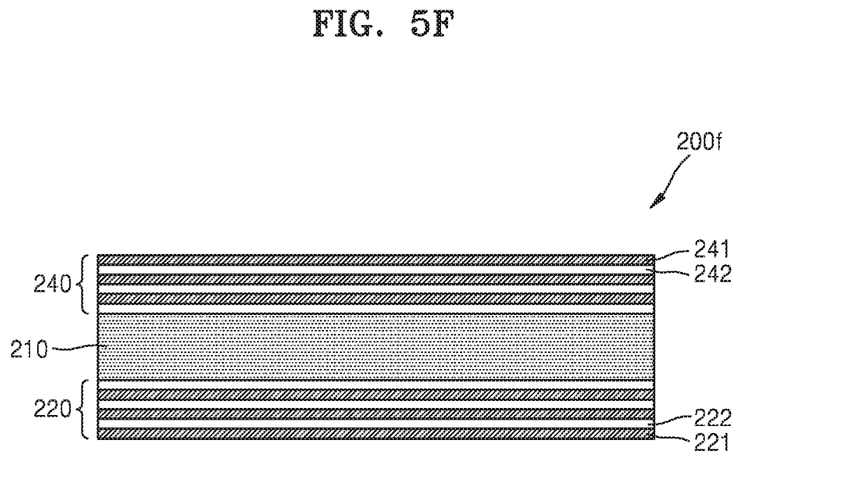

A filter unit 200f of FIG. 5F may include the first Bragg reflection layer 220 and the second Bragg reflection layer 240 which are respectively provided on a bottom surface and a top surface of the cavity layer 210. In this structure, light IL1 incident from the outside into the cavity layer 210 is reflected by the first Bragg reflection layers 220 and the second Bragg reflection layer 240 and reciprocates in the cavity layer 210. Light having a specific resonance wavelength in this process passes through the first Bragg reflection layer 220 and is emitted to the outside. A resonance wavelength may be determined by an effective refractive index of the filter unit 200f.

Figure 6:
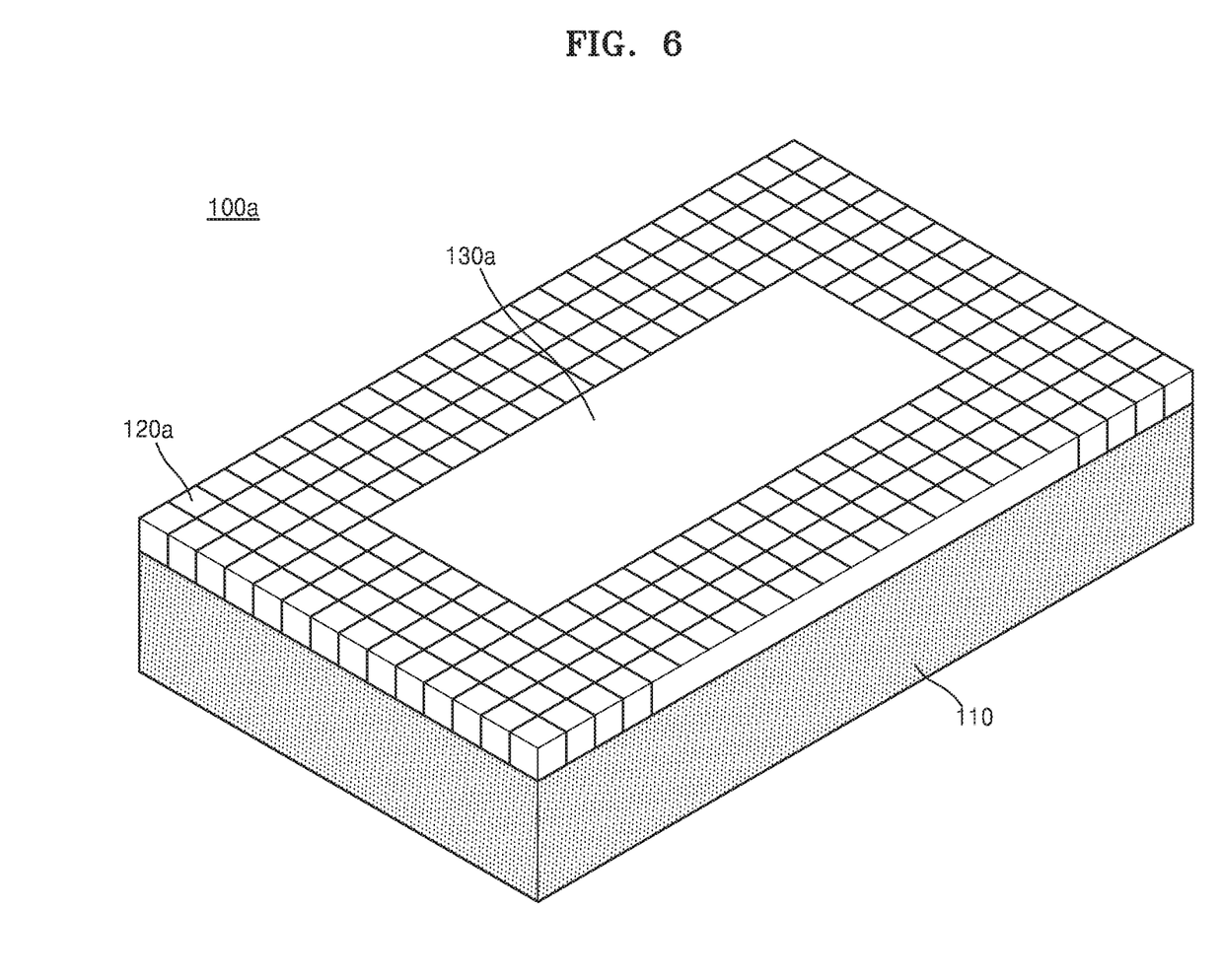
FIG. 6 is a perspective view illustrating an arrangement of a band-pass filter layer on the image sensor according to an example embodiment.

FIG. 6 is a perspective view illustrating an arrangement of a band-pass filter layer 120a on the image sensor 110 according to an example embodiment. As shown in FIG. 6, a planarization layer 130a may be surrounded by the band-pass filter layer 120a. Accordingly, pixels arranged in a middle portion of the image sensor 110 may be used to obtain outer appearance information of an object, that is, an image of the object, and pixels arranged in an edge portion of the image sensor 110 may be used to obtain physical property information of the object.

Figure 7:
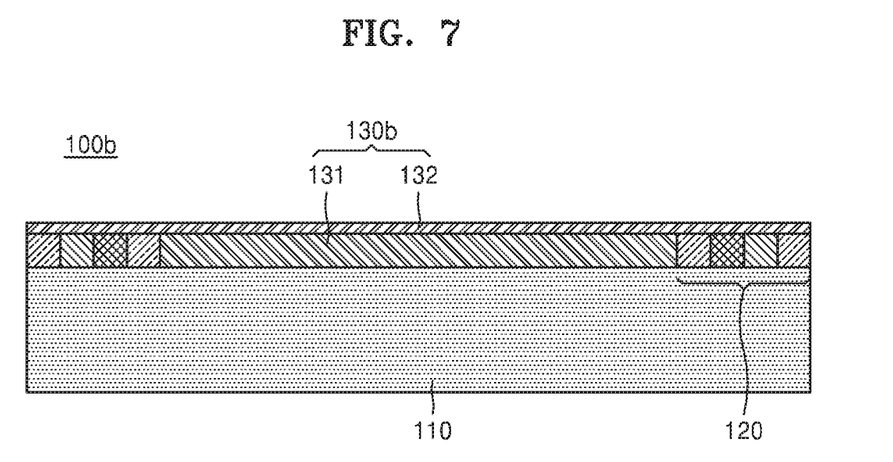
FIG. 7 is a cross-sectional view of a dual image sensor according to an example embodiment.

FIG. 7 is a cross-sectional view of a dual image sensor 100b according to an example embodiment. When FIGS. 1 and 7 are compared with each other, a planarization layer 130b of FIG. 7 may cover the band-pass filter layer 120. The planarization layer 130b may eliminate a level difference between the band-pass filter layer 120 and the planarization layer 130b by also being located on the band-pass filter layer 120. For example, the planarization layer 130b may include a first planarization layer 131 located on a second area of the image sensor 110 and a second planarization layer 132 located on the first planarization layer 131 and the band-pass filter layer 120. Each of the first planarization layers 131 and the second planarization layer 132 may be formed of a transparent insulating material.

Figure 8:
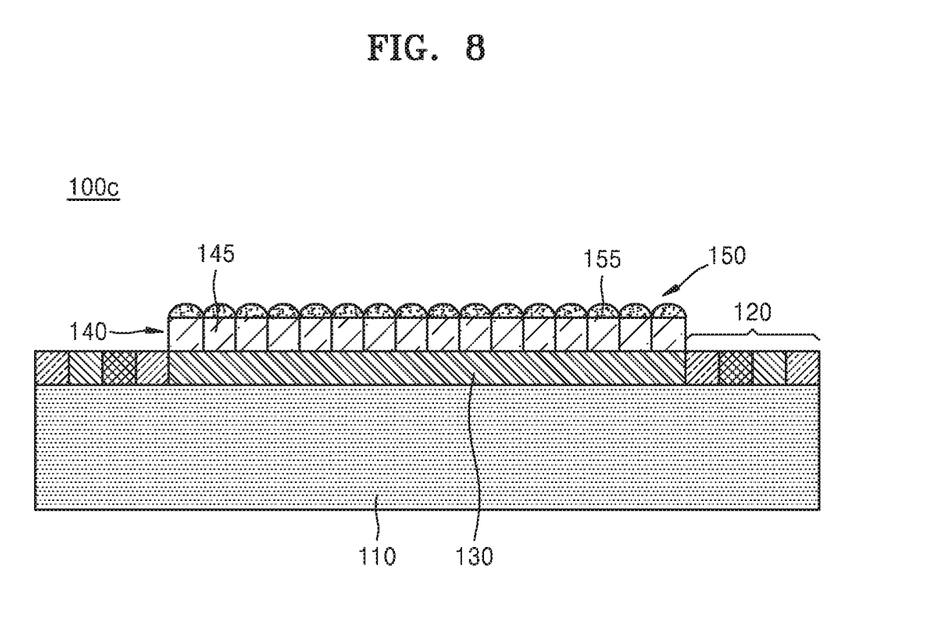
FIGS. 8 and 9 are cross-sectional views of dual image sensors according to example embodiments.
Figure 9:
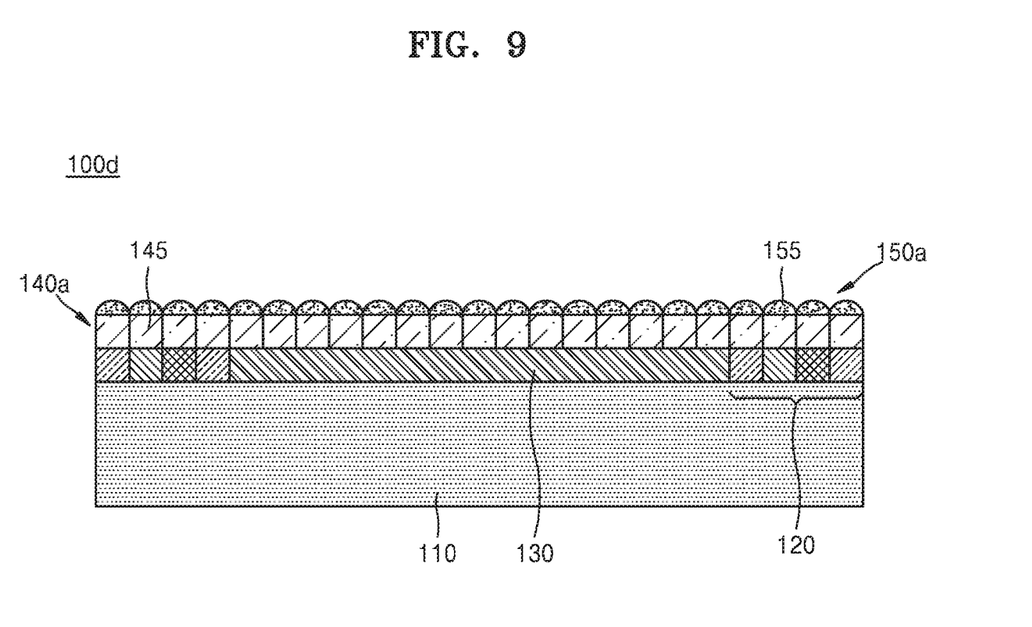

FIGS. 8 and 9 are cross-sectional views of dual image sensors 100c and 100d according to example embodiments. When FIGS. 1 and 8 are compared with each other, the dual image sensor 100c of FIG. 8 may further include a color filter layer 140 including a plurality of color filters 145 located on the planarization layer 130 and a micro-lens array 150 including a plurality of micro-lenses 155 located on the color filter layer 140. An image sensor 110c may detect light incident through the color filter layer 140. The color filters 145, for example, a red color filter, a green color filter, and a blue color filter, may be arranged to respectively correspond to pixels.

The micro-lens array 150 may be located on the color filter layer 140. Each of the micro-lenses 155 may have a convex shape as shown in FIGS. 8 and 9. The convex shape of the micro-lens 155 enables incident light to be concentrated on a photodiode of a pixel. The micro-lens 155 may be formed of an organic material such as a photoresist (PR). However, example embodiments are not limited thereto, and the micro-lens 155 may be formed of an inorganic material.

A protective film may be further located on the micro-lens array 150. The protective film may be an inorganic oxide film. Since the micro-lens 155 is formed of an organic material, the micro-lens 155 may be weak to an external impact. Accordingly, the protective film may protect the micro-lens 155 from an external impact. In addition, there may be a small space between adjacent micro-lenses 155, and the protective film may fill the small space. Once the small space between adjacent micro-lenses 155 is filled, incident light focusing capability may be improved.

When FIGS. 8 and 9 are compared with each other, a color filter layer 140a and a micro-lens array 150a of the dual image sensor 100d of FIG. 9 may extend to and may be located on the band-pass filter layer 120. The color filter layer 140a increases a transmittance of light having a specific wavelength by absorbing or blocking light having a wavelength other than the specific wavelength. For example, a red filter may increase a transmittance of light having a red wavelength by absorbing or blocking light having blue and green wavelengths. In this case, the red filter may transmit light (e.g., infrared light) other than visible light. Accordingly, as long as a resonance wavelength of the band-pass filter layer 120 does not overlap a wavelength filtered by a color filter, the color filter layer 140a may be located on the band-pass filter layer 120.

Figure 10:
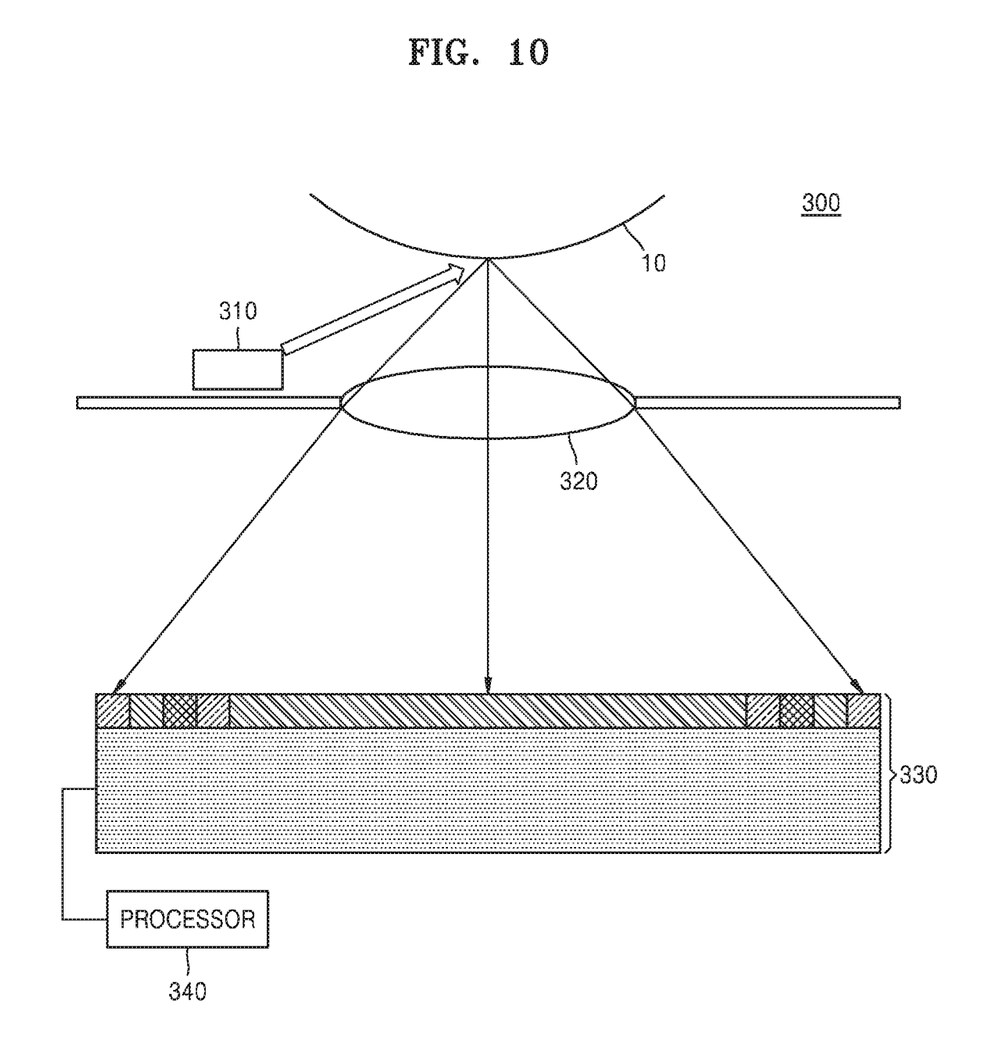
FIG. 10 is a cross-sectional view illustrating an optical device including an image sensor according to an example embodiment.

FIG. 10 is a cross-sectional view illustrating an optical device 300 including an image sensor according to an example embodiment. As shown in FIG. 10, the optical device 300 may include a light source 310, a focusing optical system 320, a dual image sensor 330, and a processor 340.

The light source 310 may emit light to obtain physical property information of an object 10. The light source 310 may emit flickering light at a predetermined frequency. The light source 310 may include a semiconductor light-emitting device such as a light emitting diode (LED) or a laser diode (LD) and a gas discharge lamp such as a halogen lamp or a xenon lamp. The light source 310 may be a surface light source having a large emission area and capable of emitting uniform light so that light is emitted to a predetermined portion of an object 10. For example, a backlight unit may be used as the light source 310.

Light emitted by the light source 310 may vary according to the object 10 and a type of a target material. For example, when the object 10 is a person and the target material is a material in the skin of the object 10, the light source 310 may emit light having a red light wavelength or a near-infrared wavelength, for example, light having a center wavelength of 700 nm to 1400 nm. The above wavelength range is an example and the light source 310 may emit light having another wavelength according to the target material, etc.

The object 10 may be a human or an animal. However, example embodiments are not limited thereto. The object 10 may be a part included in the object 10. For example, the object 10 may be a biological source such as physiological fluid including blood, interstitial fluid, saliva, ocular lens fluid, cerebral spinal fluid, sweat, urine, milk, ascites fluid, raucous, synovial fluid, peritoneal fluid, vaginal fluid, amniotic fluid, or the like. However, example embodiments are not limited thereto. For example, the object 10 may be an environmental sample, food, or the like for water quality management or soil management.

The target material may be a material included in the object 10 and having unique optical properties. The target material may be a unique material included in the object 10 or a material obtained by combining a material included in the object 10 with a fluorescent substance. Examples of the target material may include, but are not limited to, high sensitivity C-reactive protein (hsCRP), MicroCRP, HbA1c (glycated hemoglobin), microalbumin, prostate specific antigen (PSA), alpha-fetoprotein (AFP), cardiac troponin I (cTnI),), glucose, and C-reactive protein (CRP).

The target material may have different absorption, transmission, and reflection with respect to light having a specific wavelength according to a molecular bonding structure, a shape of a molecule, a potential energy surface (PES), masses of atoms, vibration coupling, etc. Accordingly, information about the target material may be obtained by recognizing characteristics of light reflected by or transmitted through the target material. The information about the target material may be physical property information of the object.

Light emitted from the object 10 may be incident on the dual image sensor 330 through the focusing optical system 320. Although the focusing optical system 320 includes one lens in FIG. 10, embodiments are not limited thereto and the focusing optical system 320 may include a plurality of lenses. The focusing optical system 320 may include a variable focusing lens. The dual image sensor 330 of FIG. 10 is a dual image sensor of FIG. 2. However, example embodiments are not limited thereto, and any of the above-described dual image sensors may be used. A band-pass filter layer and a planarization layer included in the dual image sensor have already been described, and thus a detailed explanation thereof will not be given.

The processor 340 may obtain the physical property information of the object 10, that is, the information about the target material by using a result received from a first area of the dual image sensor 330, and may obtain image information of the object 10 by using a result received from a second area of the dual image sensor 330.

Although all pixels of the dual image sensor 330 detect light in FIG. 10, example embodiments are not limited thereto. The first area and the second area of the dual image sensor 330 may selectively detect light. For example, when the object 10 is not focused on the second area of the dual image sensor 330, the first area of the dual image sensor 330 may detect light, and when the object 10 is focused on the second area, the second area may detect light. An operation of the dual image sensor 330 may be controlled by the processor 340.

The optical device 300 may include the dual image sensor 330, and examples of the optical device 300 may include, but are not limited to, a mobile phone, a smartphone, a laptop computer, a tablet personal computer (PC), an electronic book terminal, a digital broadcasting terminal, a personal digital assistant (PDA), a portable multimedia player (PMP), a navigation system, an MP3 player, a digital camera 160, an Internet protocol television (IPTV), a digital television (DTV), and a consumer electronics (CE) device (e.g., a refrigerator or an air conditioner including a display device). The optical device 300 may be a wearable device that may be worn on a user.

The dual image sensor according to the one or more example embodiments may obtain physical property information and image information of an object by using one image sensor. Also, a band-pass filter located on the dual image sensor may reduce a change in a resonance wavelength according to a change in an incidence angle and may resonance a wavelength in a narrow band, thereby making it possible to obtain more accurate physical property information.

While example embodiments have been described with reference to the figures, it will be understood by one of ordinary skill in the art that various changes in form and details may be made therein without departing from the spirit and scope of the present disclosure as defined by the following claims.

What is claimed is:

1. A dual image sensor comprising:
an image sensor comprising a first area and a second area, each of the first area and the second area including a plurality of pixels;
a band-pass filter layer provided on the first area, the band-pass filter layer being configured to, in response to an incidence of light that is emitted by an object and has a specific wavelength corresponding to physical property information of the object, resonate, pass and output the light through the band-pass filter layer to pixels of the first area overlapping the band-pass filter layer;
a first planarization layer provided on the second area and on a same plane as the band-pass filter layer; and
a second planarization layer provided on the first planarization layer and the band-pass filter layer,
wherein the second planarization layer contacts both the first planarization layer and the band-pass filter layer, and
wherein the first area is a peripheral portion of the image sensor, and the second area is a central portion of the image sensor, the first area and the second area corresponding to an entire area of an upper surface of the image sensor.

2. The dual image sensor of claim 1, wherein the first planarization layer has a thickness that is equal to or greater than a thickness of the band-pass filter layer.

3. The dual image sensor of claim 1, wherein the first planarization layer comprises an insulating material.

4. The dual image sensor of claim 1, wherein the first planarization layer comprises at least one of silicon oxide, silicon nitride, and resin.

5. The dual image sensor of claim 1, wherein the band-pass filter layer contacts the first planarization layer.

6. The dual image sensor of claim 1, wherein the band-pass filter layer surrounds the first planarization layer on the same plane of the image sensor.

7. The dual image sensor of claim 1, wherein the image sensor comprises at least one of a charge-coupled device and a complementary metal-oxide semiconductor.

8. The dual image sensor of claim 1, wherein the band-pass filter layer comprises a plurality of filter units configured to resonate and emit the light having the specific wavelength.

9. A dual image sensor comprising:
an image sensor comprising a first area and a second area, each of the first area and the second area including a plurality of pixels;
a band-pass filter layer provided on the first area, the band-pass filter layer being configured to transmit, to the image sensor, light that is emitted by an object and has a specific wavelength corresponding to physical property information of the object; and
a planarization layer provided on the second area and on a same plane as the band-pass filter layer,
wherein the band-pass filter layer comprises a plurality of filter units configured to resonate and emit the light having the specific wavelength, and
wherein at least one filter unit of the plurality of filter units comprises:
a cavity layer;
a Bragg reflection layer provided on a first surface of the cavity layer; and
a pattern reflection layer provided on a second surface of the cavity layer that is opposite the first surface of the cavity layer, the pattern reflection layer being configured to generate guided mode resonance and comprising a plurality of reflective structures that are periodically arranged.

10. The dual image sensor of claim 9, wherein the pattern reflection layer further comprises a filling layer filling spaces between the plurality of reflective structures, the filling layer having a refractive index that is different from refractive indices of the plurality of reflective structures.

11. The dual image sensor of claim 9, wherein the pattern reflection layer further comprises a cover layer covering the plurality of reflective structures, the cover layer having a refractive index that is different from refractive indices of the plurality of reflective structures.

12. The dual image sensor of claim 9, wherein the plurality of reflective structures are periodically arranged at a pitch that is less than a resonance wavelength of the at least one filter unit of the plurality of filter units.

13. The dual image sensor of claim 9, wherein a resonance wavelength of the at least one filter unit of the plurality of filter units is based on at least one of a pitch, a thickness, and a duty cycle of the plurality of reflective structures.

14. The dual image sensor of claim 1, further comprising a color filter layer provided on the first planarization layer.

15. The dual image sensor of claim 14, wherein the color filter layer is further provided on the band-pass filter layer.

16. The dual image sensor of claim 14, further comprising a micro-lens array provided on the color filter layer.

17. The dual image sensor of claim 9, wherein the pattern reflection layer further comprises a connection layer configured to connect the plurality of reflective structures, the connection layer having a thickness that is less than a thickness of the plurality of reflective structures.

18. A dual image sensor comprising:
an image sensor comprising a first area and a second area, each of the first area and the second area including a plurality of pixels;
a band-pass filter layer provided on the first area, the band-pass filter layer being configured to transmit, to the image sensor, light that is emitted by an object and has a specific wavelength corresponding to physical property information of the object; and
a planarization layer provided on the second area and on a same plane as the band-pass filter layer,
wherein the band-pass filter layer comprises a plurality of filter units configured to resonate and emit the light having the specific wavelength, and
wherein at least one of the plurality of filter units comprises:
a cavity layer;
a first Bragg reflection layer provided on a first surface of the cavity layer;
a second Bragg reflection layer provided on a second surface of the cavity layer that is opposite the first surface of the cavity layer; and
a pattern reflection layer included in the cavity layer, the pattern reflection layer being configured to generate guided mode resonance, and comprising a plurality of reflective structures that are periodically provided.

19. The dual image sensor of claim 18, wherein the pattern reflection layer contacts an inner surface of the first Bragg reflection layer.

20. The dual image sensor of claim 19, wherein the pattern reflection layer further contacts an inner surface of the second Bragg reflection layer.

* * * * *